(12) United States Patent
Brown et al.

(10) Patent No.: US 9,184,058 B2
(45) Date of Patent: Nov. 10, 2015

(54) METHODS OF FORMING PATTERNS BY USING A BRUSH LAYER AND MASKS

(71) Applicants: Micron Technology, Inc., Boise, ID (US); Dow Global Technologies LLC, Midland, MI (US); Rohm and Haas Electronic Materials LLC, Marlborough, MA (US)

(72) Inventors: William R. Brown, Boise, ID (US); Adam Olson, Boise, ID (US); Kaveri Jain, Boise, ID (US); Ho Seop Eom, Boise, ID (US); Xue Gloria Chen, Boise, ID (US); Nik Mirin, Boise, ID (US); Dan Millward, Boise, ID (US); Peter Trefonas, III, Medway, MA (US); Phillip Dene Hustad, Natick, MA (US); Jong Keun Park, Westborough, MA (US); Christopher Nam Lee, Austin, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/139,582

(22) Filed: Dec. 23, 2013

(65) Prior Publication Data

US 2015/0179467 A1    Jun. 25, 2015

(51) Int. Cl.
| H01L 21/311 | (2006.01) |
|---|---|
| H01L 21/302 | (2006.01) |
| H01L 21/461 | (2006.01) |
| H01L 21/308 | (2006.01) |

(52) U.S. Cl.
CPC ........ *H01L 21/3088* (2013.01); *H01L 21/3081* (2013.01)

(58) Field of Classification Search
None
See application file for complete search history.

(56) References Cited

U.S. PATENT DOCUMENTS

| 7,786,015 | B2 | 8/2010 | Chen et al. | |
|---|---|---|---|---|
| 2002/0064898 | A1* | 5/2002 | Adachi et al. | 438/41 |
| 2004/0115924 | A1* | 6/2004 | Lee et al. | 438/629 |
| 2004/0192060 | A1* | 9/2004 | Stegemann et al. | 438/713 |
| 2007/0215986 | A1* | 9/2007 | Manger et al. | 257/632 |
| 2008/0020582 | A1* | 1/2008 | Bai | 438/714 |
| 2009/0032880 | A1* | 2/2009 | Kawaguchi et al. | 257/369 |
| 2009/0200646 | A1* | 8/2009 | Millward et al. | 257/632 |
| 2011/0312184 | A1* | 12/2011 | Lee et al. | 438/696 |
| 2013/0189846 | A1 | 7/2013 | Doebler | |

OTHER PUBLICATIONS

U.S. Appl. No. 13/712,806, filed Dec. 12, 2012 by Sipani et al.
U.S. Appl. No. 13/712,806, filed Dec. 12, 2012 by Vishal Sipani et al.
U.S. Appl. No. 13/786,848, filed Mar. 6, 2013 by Sipani et al.
U.S. Appl. No. 13/712,820, filed Dec. 12, 2012 by Khurana et al.
U.S. Appl. No. 13/712,830, filed Dec. 23, 2013 by Trapp et al.

* cited by examiner

*Primary Examiner* — Mamadou Diallo
*Assistant Examiner* — Jay C Chang
(74) *Attorney, Agent, or Firm* — Wells St. John P.S.

(57) ABSTRACT

Some embodiments include methods of forming patterns. A first mask is formed over a material. The first mask has features extending therein and defines a first pattern. The first pattern has a first level of uniformity across a distribution of the features. A brush layer is formed across the first mask and within the features to narrow the features and create a second mask from the first mask. The second mask has a second level of uniformity across the narrowed features which is greater than the first level of uniformity. A pattern is transferred from the second mask into the material.

15 Claims, 18 Drawing Sheets

METHODS OF FORMING PATTERNS BY USING A BRUSH LAYER AND MASKS

TECHNICAL FIELD

Methods of forming patterns.

BACKGROUND

Integrated circuit fabrication often involves formation of patterned masks across materials, followed by transfer of patterns from the mask into the materials. For instance, patterned masks may be utilized for fabrication of memory, logic, etc.

A continuing goal is to increase density of integrated circuitry. A related goal is to increase density of features within patterned masks. However, difficulties may be encountered in attempting to create uniform, dense patterns of features within masks. Accordingly, it is desired to develop new methods of forming patterned masks.

BRIEF DESCRIPTION OF THE DRAWINGS

FIGS. 5A-13A are diagrammatic cross-sectional side views along the lines A-A of FIGS. 5-13, respectively.

DETAILED DESCRIPTION OF THE ILLUSTRATED EMBODIMENTS

Some embodiments include methods of utilizing a brush layer to improve uniformity across a population of patterned features. The term "brush layer" is utilized herein to refer to a layer formed by covalent bonding of a polymeric organic material to a surface. In some embodiments, the brush layer may comprise a siloxane; and may be formed from a siloxane-containing precursor such as, for example, a precursor comprising poly(dimethylsiloxane) (PDMS). In some embodiments, the brush layer may be formed from precursors comprising other organic polymers either in addition to, or alternatively to, siloxane-containing polymers. For example, the brush layer may be formed utilizing precursors comprising one or both of polystyrene (PS) and poly(methylmethacrylate) (PMMA). The brush layer precursors have one or more substituents suitable for reacting with surfaces to thereby covalently bond (i.e., graft) the brush layer to the surfaces. Such substituents may comprise hydroxyl moieties, sulfhydryl moieties, etc.

An example utilization of a brush layer to improve uniformity across a population of patterned features is described with reference to FIGS. 1 and 2.

Figure 1:
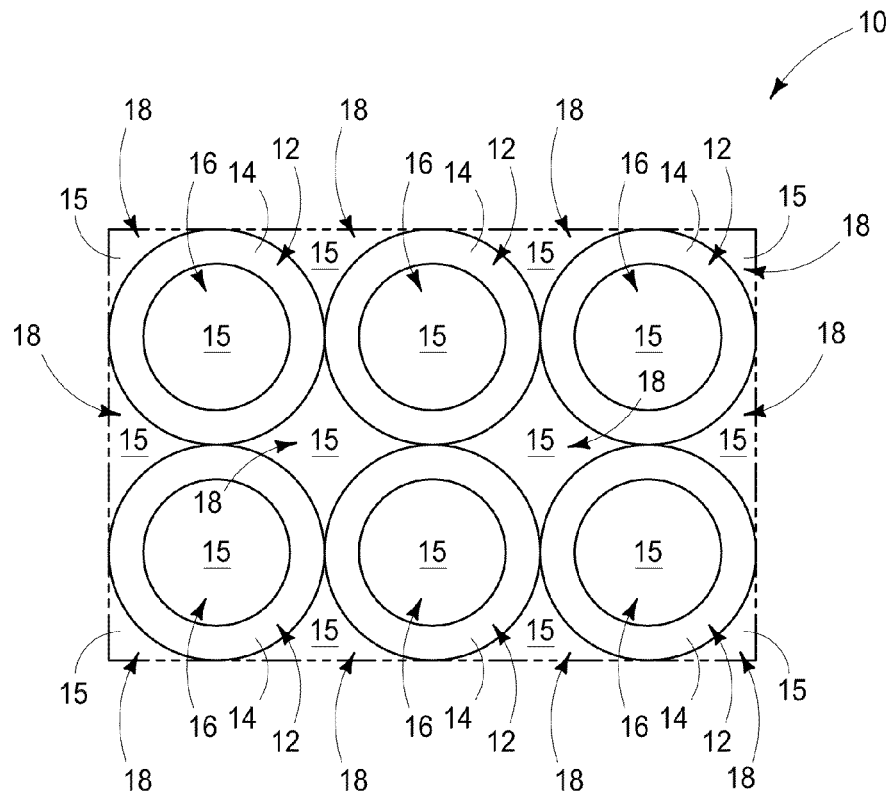
FIGS. 1 and 2 are diagrammatic top views of a semiconductor construction at process stages of an example embodiment.

Referring to FIG. 1, a portion of a construction 10 is shown in top view. The construction comprises rings 12 of masking material 14 formed across an upper surface of a base 15. The rings 12 touch one another, and form two sets of openings over base 15. One set corresponds to circular openings 16 within the middle of the rings, and another set corresponds to diamond-shaped openings 18 bounded by four adjacent rings touching one another. In some embodiments, the rings 12 may be considered to form a first mask over base 15, with the openings 16 and 18 corresponding to first features extending through the first mask and defining a first pattern. Such first pattern has a first level of uniformity across a distribution of the features 16 and 18, and such level of uniformity is low due to the openings 18 being of significantly different shape relative to the openings 16.

Figure 2:
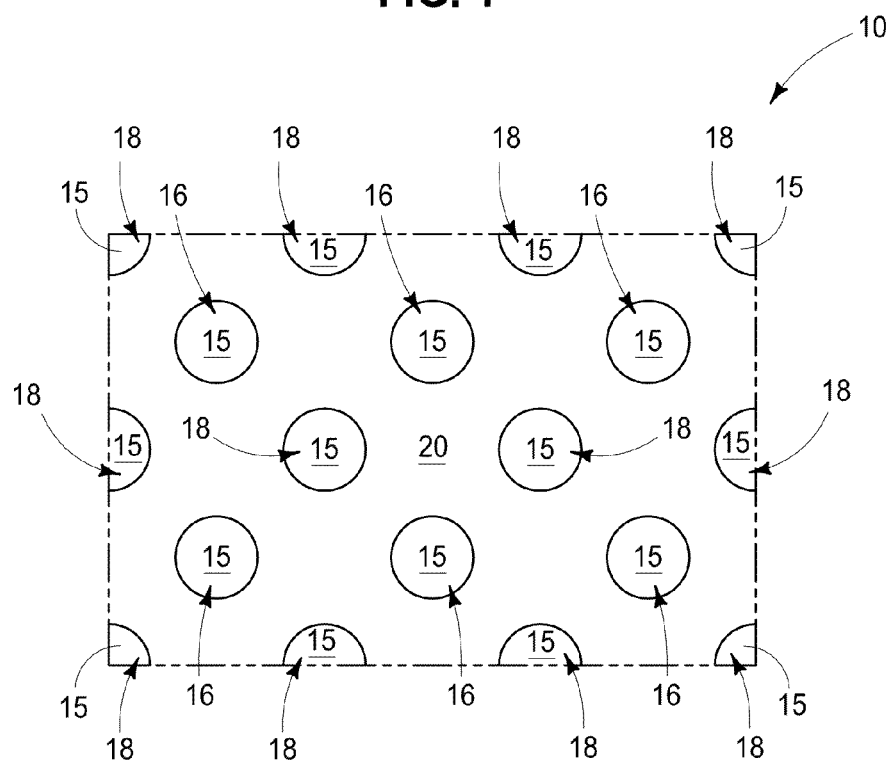

Referring next to FIG. 2, a brush layer 20 is formed to be selectively on material 14 (FIG. 1) relative to the material of base 15, and such narrows openings 16 and 18. The formation of brush layer 20 may be considered to form a second mask from the first mask of FIG. 1. Such second mask has a greater level of uniformity than did the first mask due to differences between the shapes of openings 16 and 18 being alleviated through formation of the brush layer. Specifically, the brush layer has partially filled openings 16 and 18, and smoothed the differences between such openings. The smoothing may result, at least in part, from the brush layer achieving a thermodynamically-favored balance of surface tension and other forces whereby hydrophobic chains of the brush layer assemble together in a manner which substantially optimizes the diminished free energy from minimizing surface area with the increased free energy from chain stretching to achieve a substantially lowest overall free energy. Such forms substantially circular peripheral patterns along interiors of the openings due to substantially circular peripheral patterns having less surface area than other peripheral patterns (with the term "substantially circular" meaning circular to within reasonable tolerances of fabrication and measurement). In subsequent processing, the pattern of openings 16 and 18 may be transferred into base 15.

Another example utilization of a brush layer to improve uniformity across a population of patterned features is described with reference to FIGS. 3 and 4.

Figure 3:
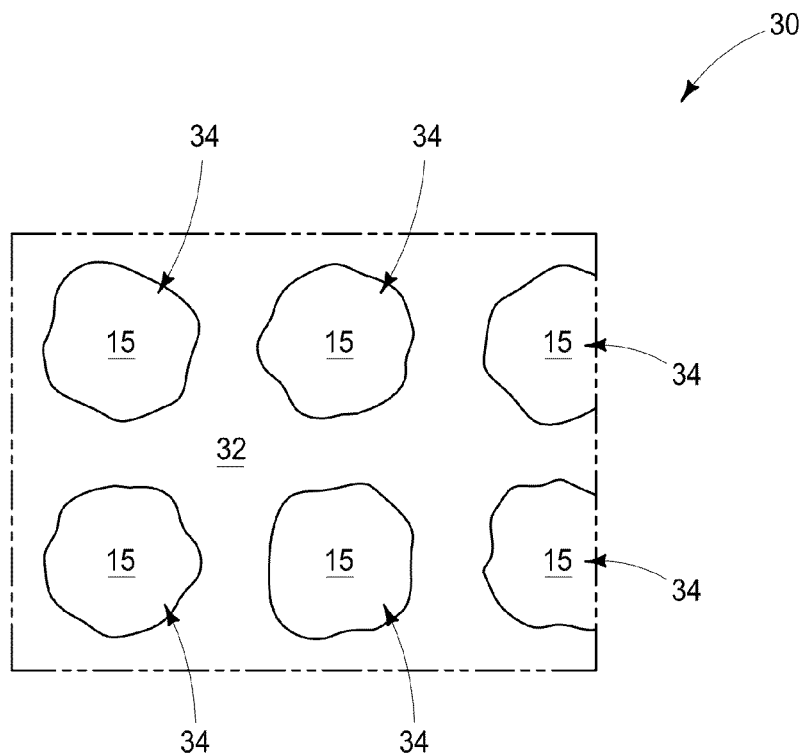
FIGS. 3 and 4 are diagrammatic top views of a semiconductor construction at process stages of another example embodiment.

Referring to FIG. 3, a portion of a construction 30 is shown in top view. The construction comprises patterned masking material 32 formed across an upper surface of the base 15. The masking material has features 34 corresponding to openings which extend through the masking material. Such openings have irregular peripheral surfaces. A distribution of shapes and sizes across the population of openings 34 has a low level of uniformity due to the irregular peripheral surfaces of the openings.

Figure 4:
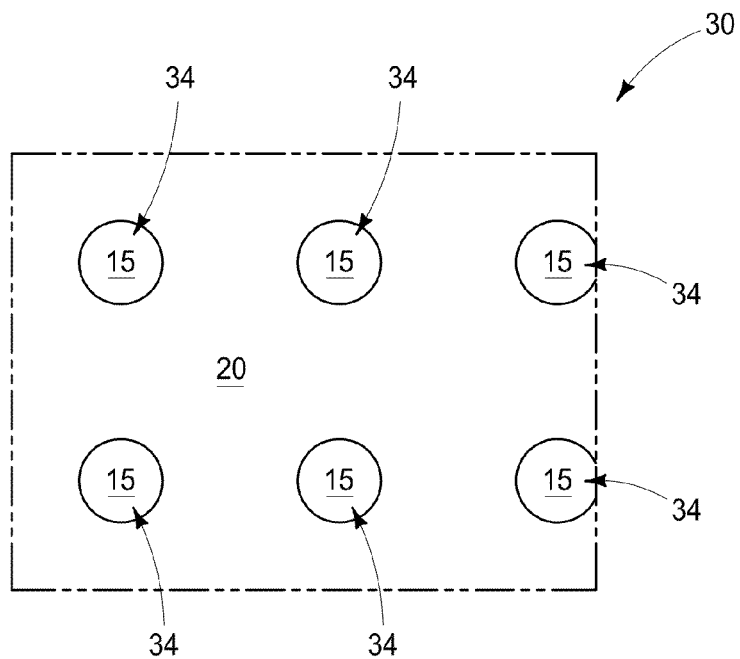

Referring next to FIG. 4, brush layer 20 is formed to be selectively on masking material 34 (FIG. 3) relative to the material of base 15. The brush layer narrows openings 34 while reducing irregularities across the peripheral surfaces. The formation of brush layer 20 may be considered to form a second mask from the first mask of FIG. 3. The second mask of FIG. 4 has a greater level of uniformity across the population of openings 34 than does the first mask of FIG. 3. In processing subsequent to the stage of FIG. 4, the pattern of openings 34 may be transferred into base 15.

In the embodiments of FIGS. 1-4, the uniform features formed in the second masks (the features 16 and 18 in the mask of FIG. 2, and the features 34 in the mask of FIG. 4) have substantially circular peripheries. In other embodiments, other feature shapes may be formed. For instance, if the original patterns in the mask are more elongated than the illustrated features, then the features formed utilizing the brush layer may be elongated rather than being circular.

There are numerous applications in which it is desired to form a mask having a high level of uniformity across a population of features. An example embodiment is described with reference to FIGS. 5-13.

Figure 5:
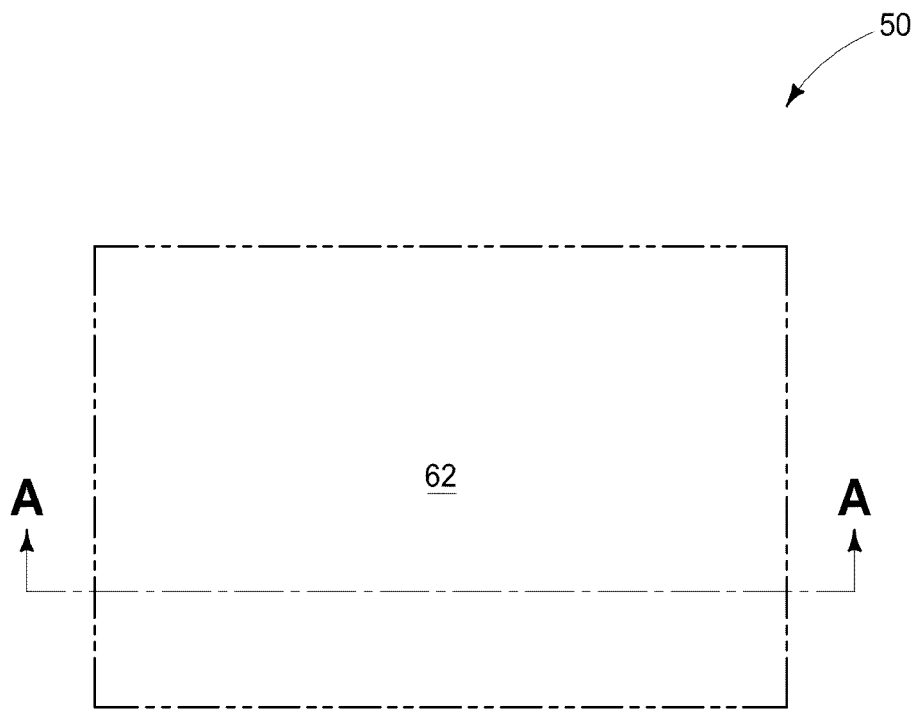
FIGS. 5-13 are diagrammatic top views of a semiconductor construction at process stages of another example embodiment.
Figure 5A:
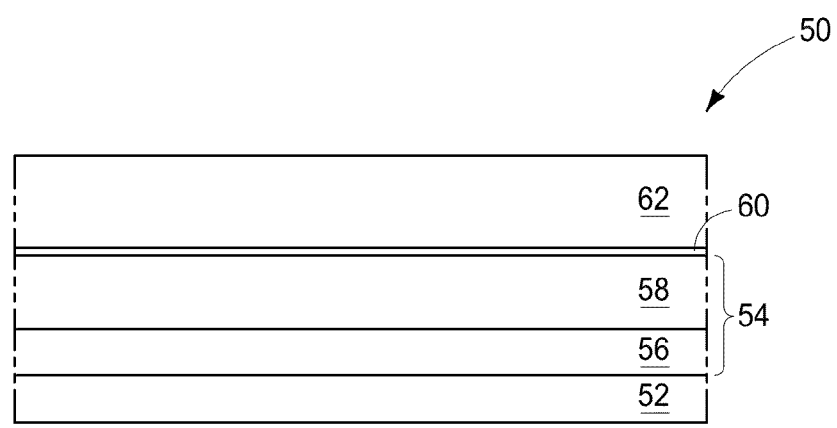

Referring to FIGS. 5 and 5A, a construction 50 comprises a semiconductor base 52 having a stack 54 thereover. The stack comprises a carbon-containing material 58 over an electrically insulative material 56. Photoresist 62 is over the stack 54, and in the shown embodiment is spaced from such stack by a deposited antireflective coating (DARC) 60.

The base 52 may comprise semiconductor material, and in some embodiments may comprise, consist essentially of, or consist of monocrystalline silicon. In some embodiments, base 52 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 52 may correspond to a semiconductor substrate containing one or more materials associated with integrated circuit fabrication. Some of the materials may be under the shown region of base 52 and/or may be laterally adjacent the shown region of base 52; and may correspond to, for example, one or more of refractory metal materials, barrier materials, diffusion materials, insulator materials, etc.

The base 52 may support integrated circuitry in some embodiments. For instance, an upper region of base 52 may comprise an array of conductive nodes (not shown), and processing of FIGS. 5-13 may be utilized to form a pattern suitable for forming electrically conductive contacts to such conductive nodes. As another example, an upper region of base 52 may comprise semiconductor material, and processing of FIGS. 5-13 may be utilized to form a pattern suitable for forming conductively-doped implant regions within such conductive material. As yet another example, the base 52 may support a memory array (for instance, a flash memory array, a DRAM array, etc.), and the processing of FIGS. 5-13 may be utilized to form a pattern suitable for aligning electrically conductive contacts to individual memory cells.

The electrically insulative material 56 may comprise any suitable composition or combination of compositions; and in some embodiments may comprise an inorganic oxide and/or an inorganic nitride. For instance, in some embodiments material 56 may comprise, consist essentially of, or consist of one or both of silicon dioxide and silicon nitride.

The carbon-containing material 58 may comprise, consist essentially of, or consist of carbon. For instance, in some embodiments the material 58 may consist of transparent carbon.

The DARC 60 may comprise any suitable composition or combination of compositions; and in some embodiments may comprise, consist essentially of, or consist of silicon oxynitride. Suitable materials for DARC 60 may include materials having appropriate optical properties (e.g., n+k values at 193 nanometers) and chemical properties (e.g., a surface which can graft with brush layer precursor).

The photoresist 62 may be any suitable composition.

Figure 6:
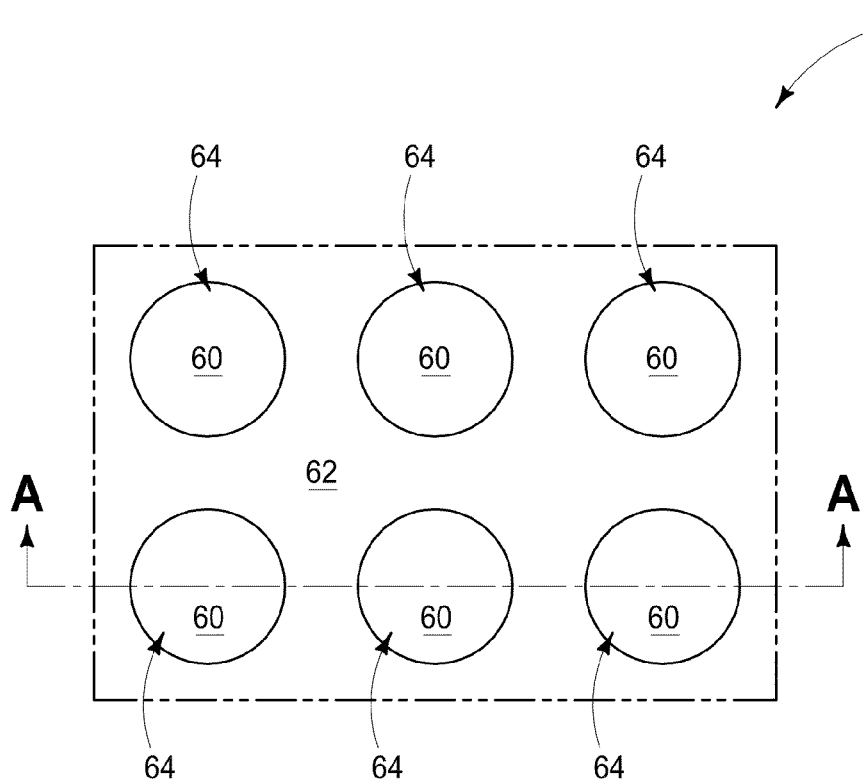
Figure 6A:
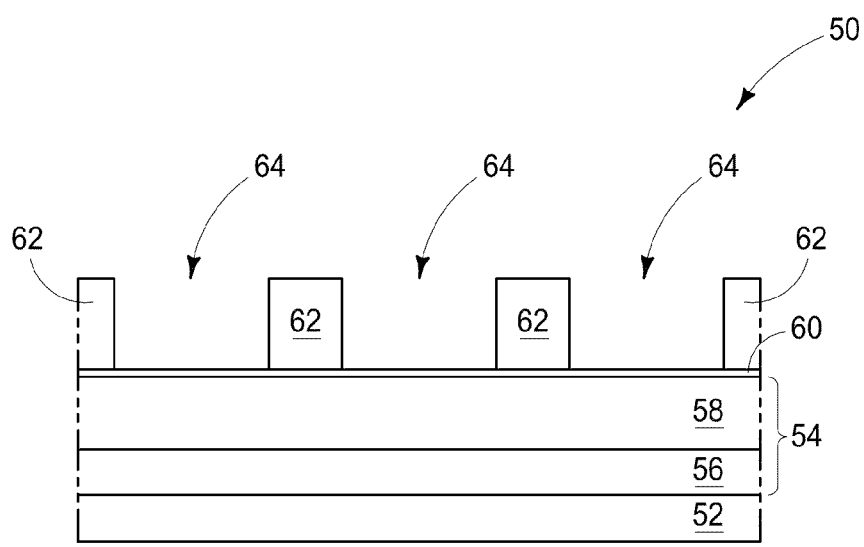

Referring to FIGS. 6 and 6A, an arrangement of openings 64 is formed within photoresist 62 through appropriate photolithographic processing. The illustrated openings 64 are example features, and other feature shapes may be formed in other embodiments.

Figure 7:
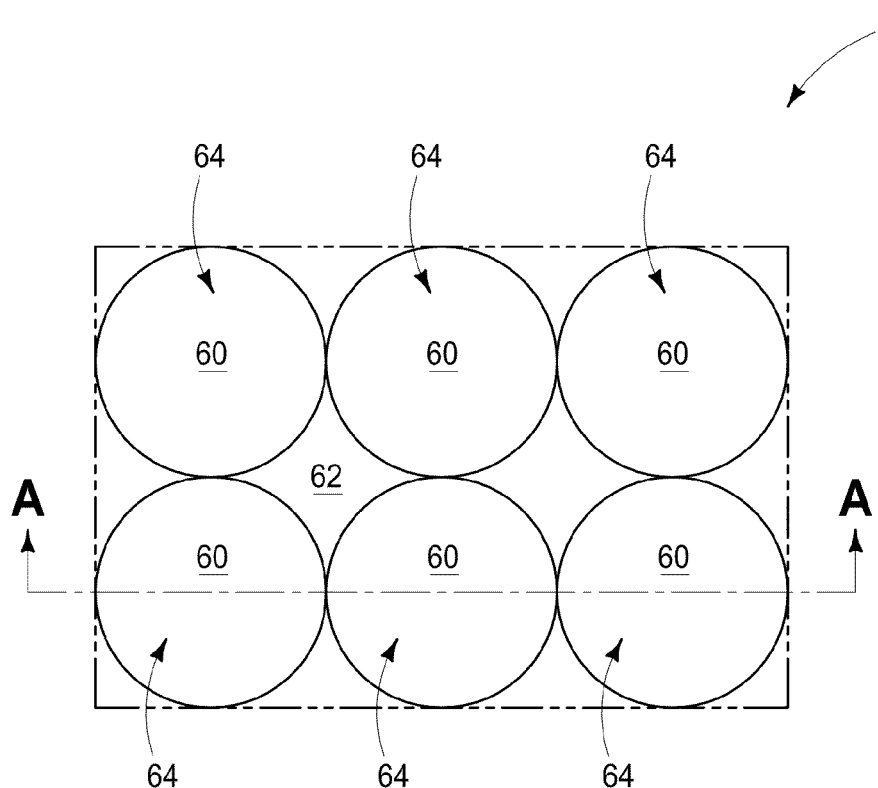
Figure 7A:
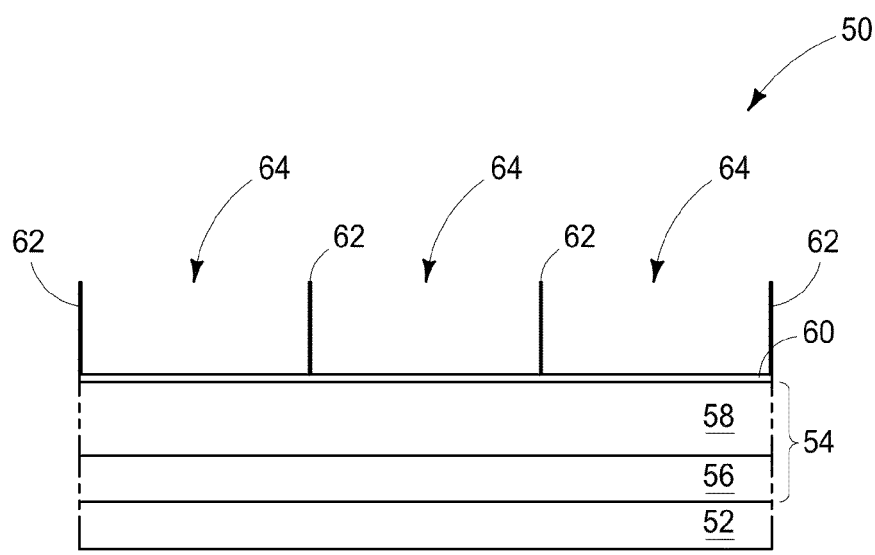

Referring to FIGS. 7 and 7A, the openings 64 are widened. In the illustrated embodiment the openings 64 are widened to an extent that they touch one another. In other embodiments, the openings may be widened to a lesser extent so that they do not touch one another. In yet other embodiments, the openings may be widened to a greater extent so that they merge with one another. In some embodiments, the arrangement of openings of FIGS. 6 and 6A may be considered to be a first arrangement of openings formed within photoresist, and the widened openings of FIGS. 7 and 7A may be considered to be a second arrangement of openings within the photoresist.

Figure 8:
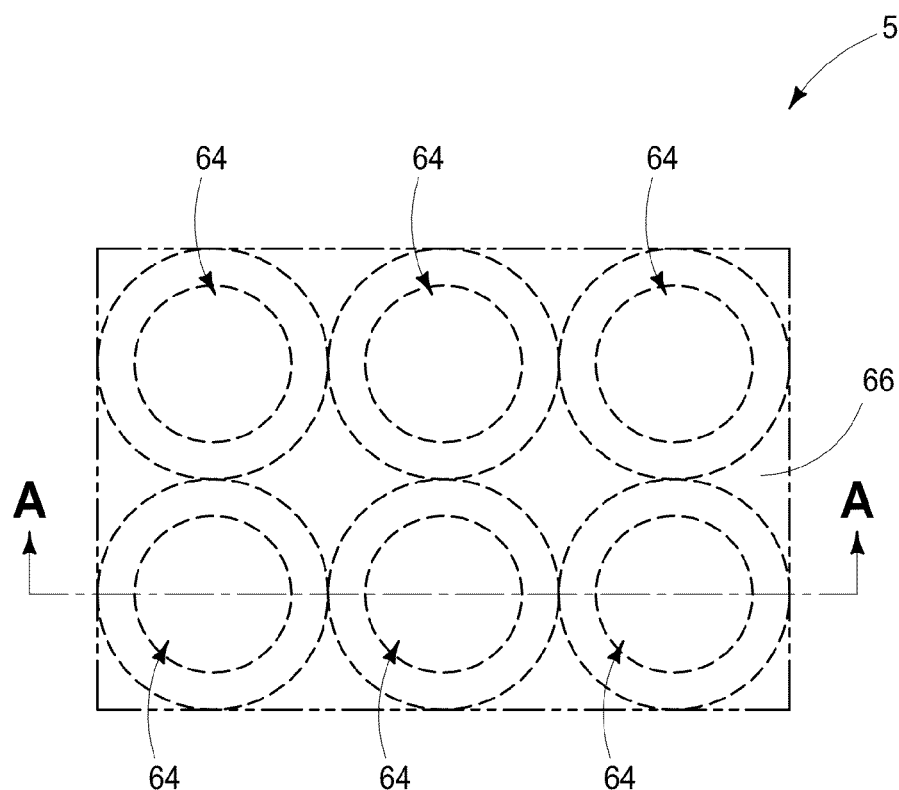
Figure 8A:
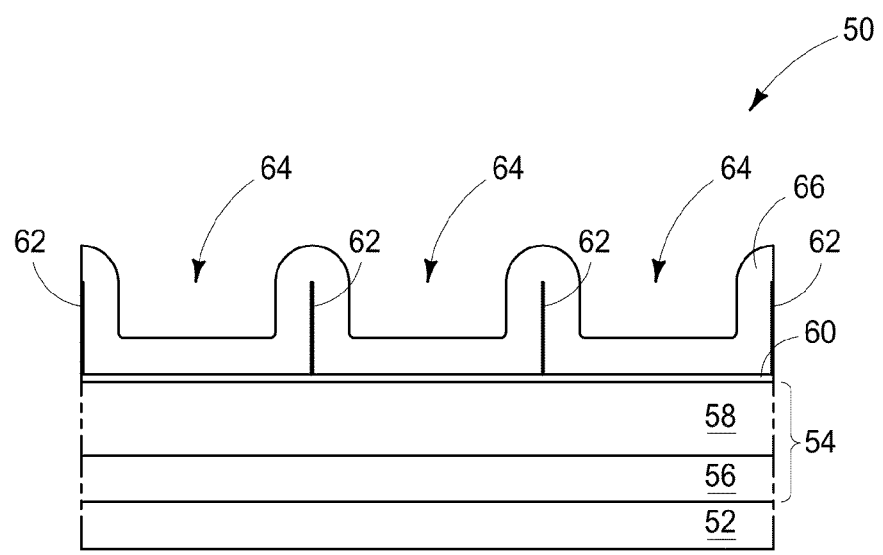

Referring to FIGS. 8 and 8A, the openings 64 are lined with spacer material 66. The spacer material has a surface which reacts with brush layer precursor. In some embodiments, such surface may comprise oxygen, and the spacer material may be referred to as an oxygen-containing film. For instance, the spacer material may comprise one or more inorganic oxides; such as, for example, one or more of silicon dioxide, silicon oxynitride, aluminum oxide, etc. The spacer material conformally coats the photoresist 62 to create a configuration having an undulating topography across an upper surface of construction 50. The spacer material may be formed utilizing any suitable methodology, including, for example, atomic layer deposition.

In some embodiments, the spacer material may be initially formed to comprise a surface lacking oxygen, and then oxygen may be introduced along such surface utilizing oxidative conditions; such as, for example, an oxidative plasma.

In some embodiments, the spacer material may have a surface comprising one or more other elements from group 16 of the periodic table in addition to, or alternatively to, oxygen. For instance, the spacer material may have a surface comprising one or more of sulfur, selenium, etc.

Figure 9:
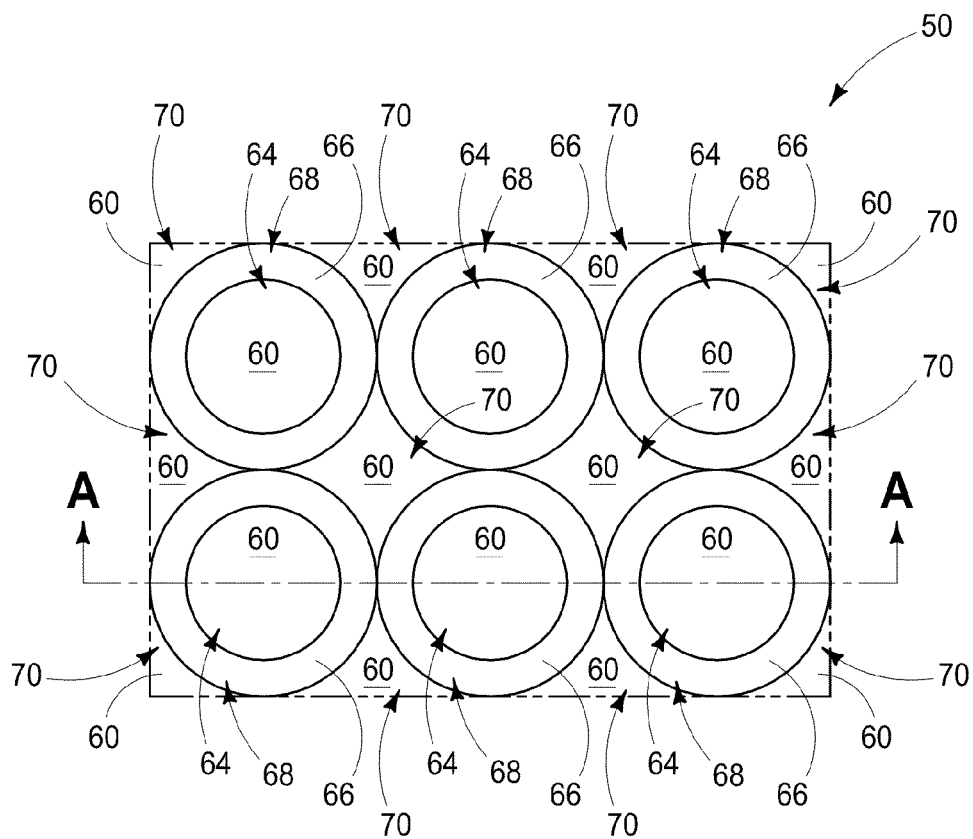
Figure 9A:
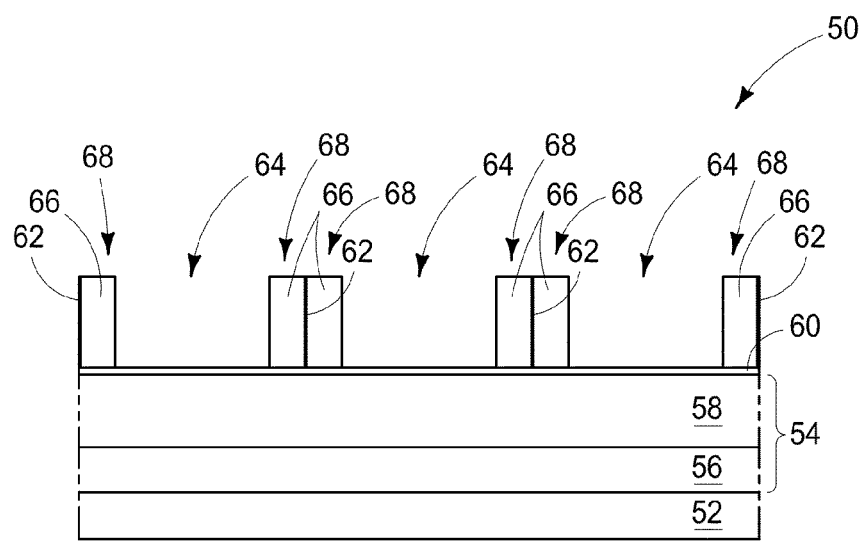

Referring to FIGS. 9 and 9A, the spacer material 66 is anisotropically etched to form spacers 68. The spacers 68 are configured as annular rings in the shown configuration.

Openings 64 extend through the central regions of the ring-shaped spacers 68 to expose an upper surface of DARC material 60. Also, photoresist 62 (visible in FIGS. 7 and 7A) is removed to form another set of openings 70 that are outside of the ring-shaped spacers 68. The openings 64 may be considered to correspond to a first set of openings, and the openings 70 may be considered to correspond to a second set of openings; with the openings of the first set having a different shape than the openings of the second set. In some embodiments, spacers 68 may be considered to form a first mask over stack 54, with such first mask having a first level of uniformity across a population of openings. Such population comprises a distribution containing openings 64 of a first shape, and openings 70 of a second shape.

Although the shown embodiment forms spacers 68 through a single deposition and etch of spacer material, in other embodiments multiple depositions and/or etches of spacer material may be utilized to tailor widths of the spacers 68. Further, additional depositions of spacer material may alleviate some of the heterogeneity between openings 64 and 70, and thereby increase uniformity across the distribution of the openings.

Figure 10:
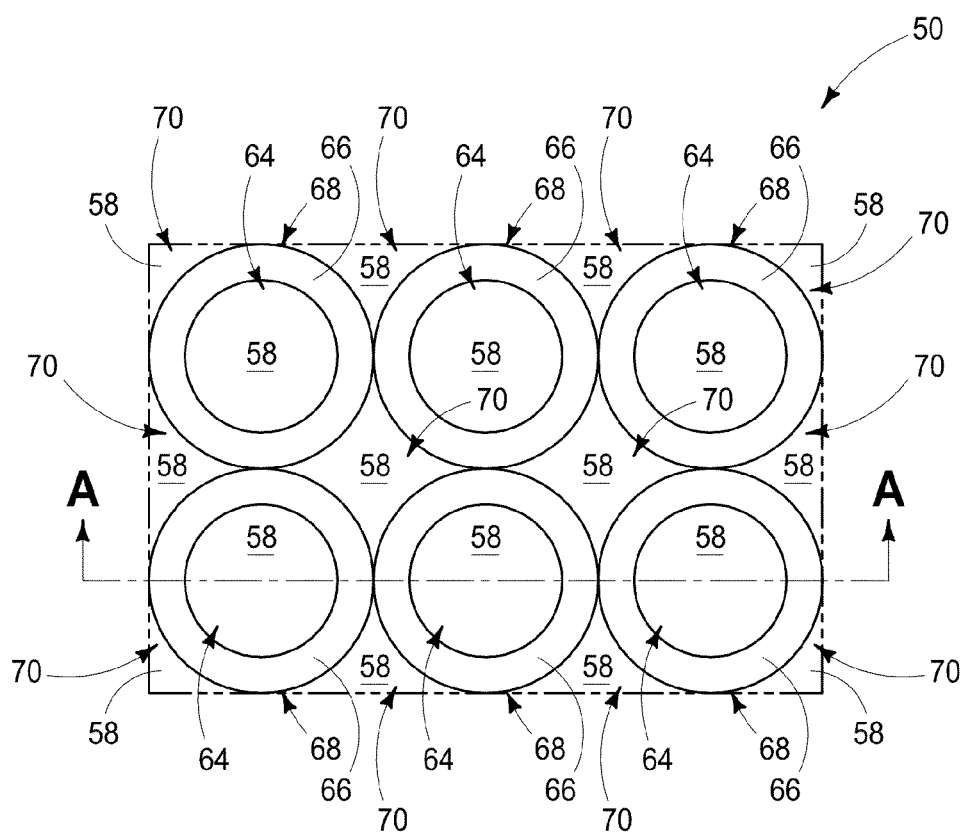
Figure 10A:
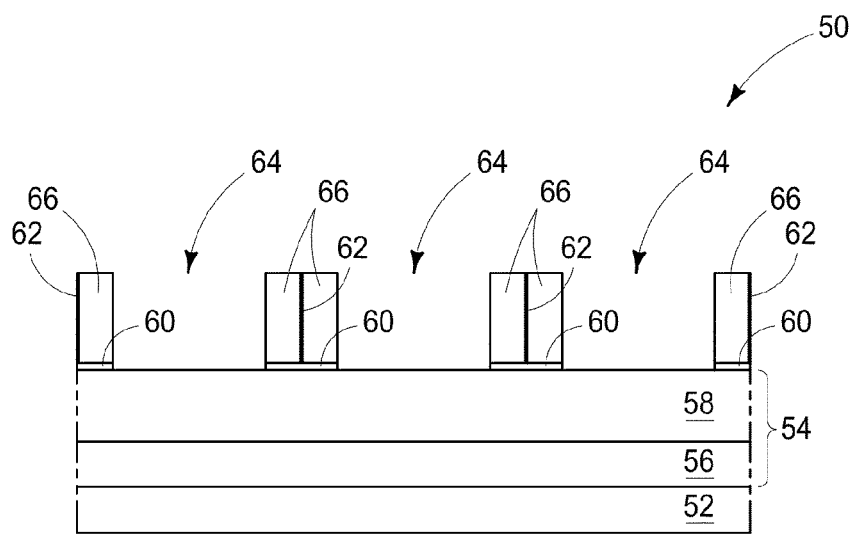

Referring to FIGS. 10 and 10A, the pattern from spacers 68 is transferred through DARC material 60 to expose an upper surface of carbon-containing material 58. In some embodiments, the materials 60 and 66 may be considered together to form a first mask over carbon-containing material 58.

Figure 11:
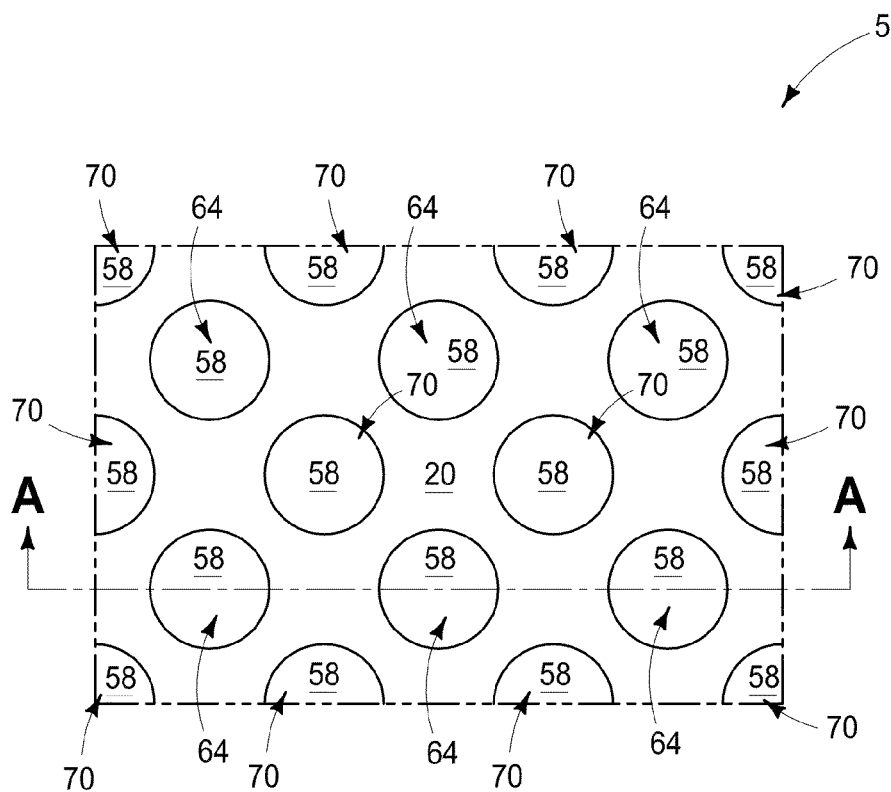
Figure 11A:
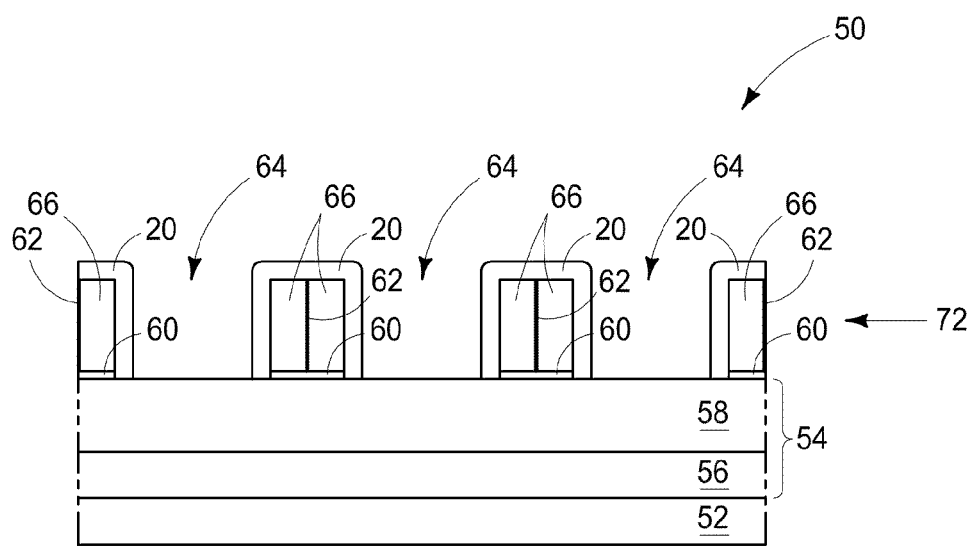

Referring to FIGS. 11 and 11A, a brush layer 20 is selectively formed on exposed surfaces of materials 60 and 66 relative to a surface of carbon-containing material 58. The brush layer reduces heterogeneity between the shapes of openings 64 and 70.

In some embodiments, the brush layer may be formed from a polymeric precursor having appropriate reactive moieties which react with oxygen (and/or other elements from group 16 of the periodic table) along exposed surfaces of materials 60 and 66 to from covalent bonds to such exposed surfaces. For instance, in some embodiments the brush layer precursor may comprise one or more of PS, PDMS and PMMA, with appropriate reactive groups, such as, for example, hydroxyl, sulfhydryl, etc. An advantage of utilizing a siloxane in the brush layer is that such may enable the carbon-containing material 58 to be selectively removed relative to the brush layer in subsequent processing (discussed below). PDMS is one example of a polymeric organic siloxane, in other embodiments the brush layer may comprise other polymeric organic siloxanes; and in some embodiments may comprise polymers containing carbon and silicon, with at least 17% silicon content (by atomic mass).

In some embodiments, the brush layer may comprise PDMS consisting of polymers within a molecular weight range of from about 5,000 atomic mass units to about 110,000 atomic mass units.

In some embodiments, the brush layer may comprise PDMS and may be selectively bonded to one or both of silicon dioxide and silicon oxynitride relative to carbon.

Processing utilized to form the brush layer may comprise exposing the construction of the type shown in FIGS. 10 and 10A to brush layer precursor under conditions which enable covalent bonding (for instance, a condensation reaction) between the precursor and exposed oxygen-containing surfaces. The conditions may include baking of the construction at a temperature of from about room temperature to about 350° C. (for brush polymers having reactive hydroxyl moieties which bond to 60/66; e.g., PDMS with hydroxyl moieties). After the brush layer is formed, a rinse may be conducted to remove excess precursor. Subsequently, the brush layer may be heated to a temperature above a glass transition temperature ($T_g$) to enable the brush layer to achieve a thermodynamically-favored state which minimizes surface area, and which thereby reduces heterogeneity across a distribution of openings.

In some embodiments, the brush layer 20 together with materials 60 and 66 may be considered to form a mask 72 across an upper surface of carbon-containing material 58. Such mask comprises openings 64 and 70 which are narrowed relative to the openings shown in the mask of FIGS. 10 and 10A. However, the openings 64 and 70 of the mask of FIGS. 11 and 11A are approximately the same size and shape as one another. Accordingly, differences between the shapes of openings 64 and 70 have been alleviated, and the mask of FIGS. 11 and 11A has a higher level of uniformity than the mask of FIGS. 10 and 10A.

In the shown embodiment of FIGS. 11 and 11A, brush layer 20 is formed selectively along materials 60 and 66 relative to carbon-containing material 58. Accordingly, the carbon-containing material remains exposed at the bottoms of openings 64 and 70 after formation of the brush layer.

The various materials 60, 66 and 58 are example materials. In some embodiments, analogous materials may comprise compositions other than those specifically described for materials 60, 66 and 58. In some embodiments, materials 60 and 66 may be referred to as first materials, and material 58 as a second material, and the brush layer may be considered to be selectively formed on the first materials relative to the second material. In other embodiments, the brush layer may form along surfaces of all of the first and second materials, and then anisotropic etching may be utilized to remove the brush layer from over the surface of material 58 and thereby expose the surface of material 58 at the bottoms of openings 64 and 70 (an analogous embodiment is described below with reference to FIGS. 18-20).

The embodiment of FIGS. 5-11 utilizes a brush layer to improve uniformity across a mask having openings with different shapes relative to one another. In other embodiments, openings may be formed under conditions such that the openings have irregularities across peripheral surfaces (analogous to the irregularities described above with reference to FIG. 3), and brush layer processing may be utilized to alleviate heterogeneity across the population of such openings.

Figure 12:
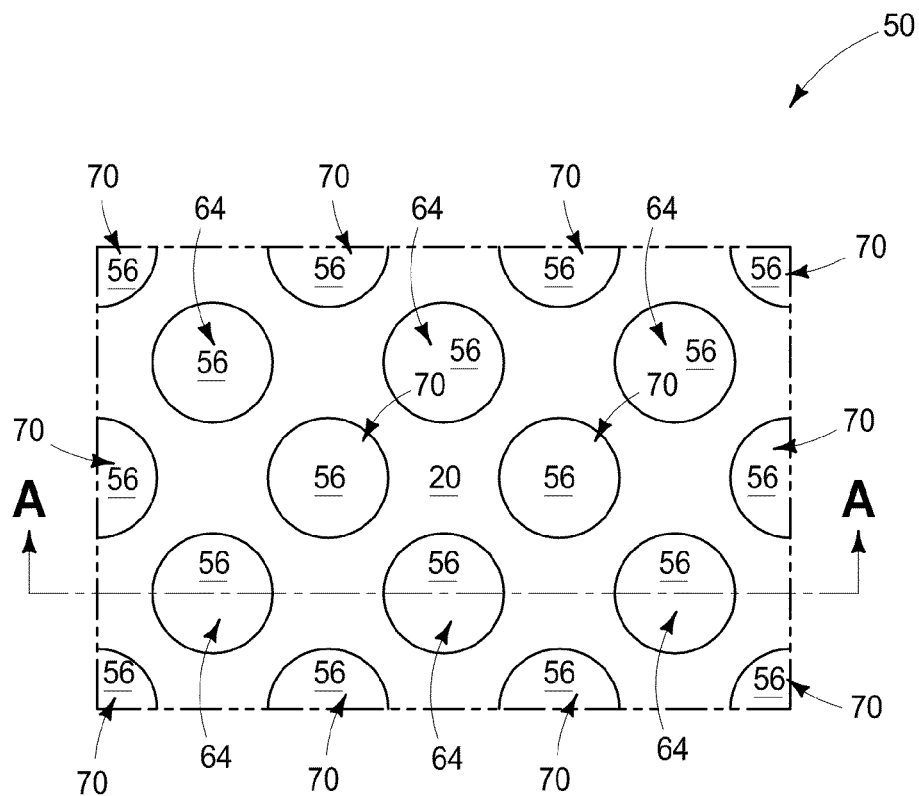
Figure 12A:
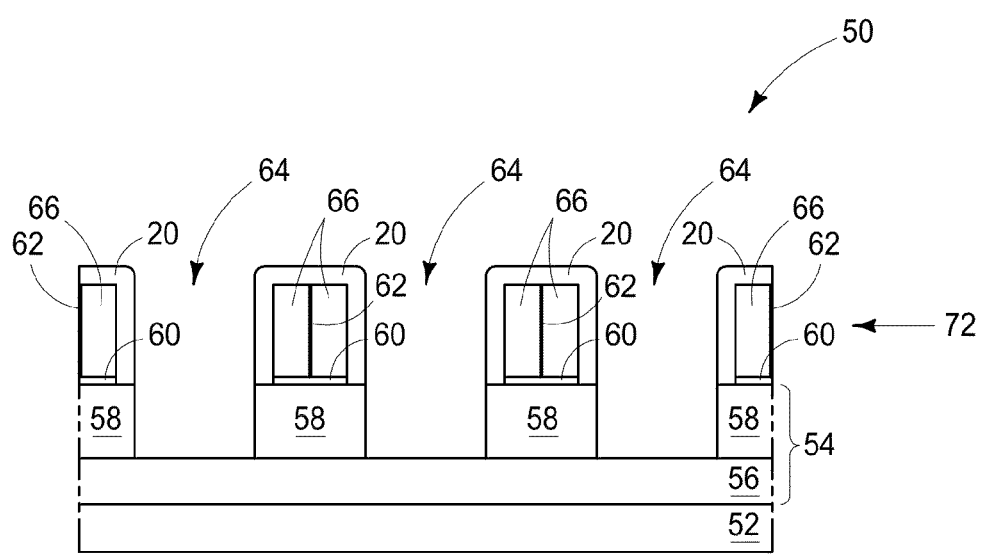

Referring to FIGS. 12 and 12A, the openings 64 and 70 are extended through material 58 (i.e., are transferred through material 58) to expose an upper surface of the electrically insulative material 56.

Figure 13:
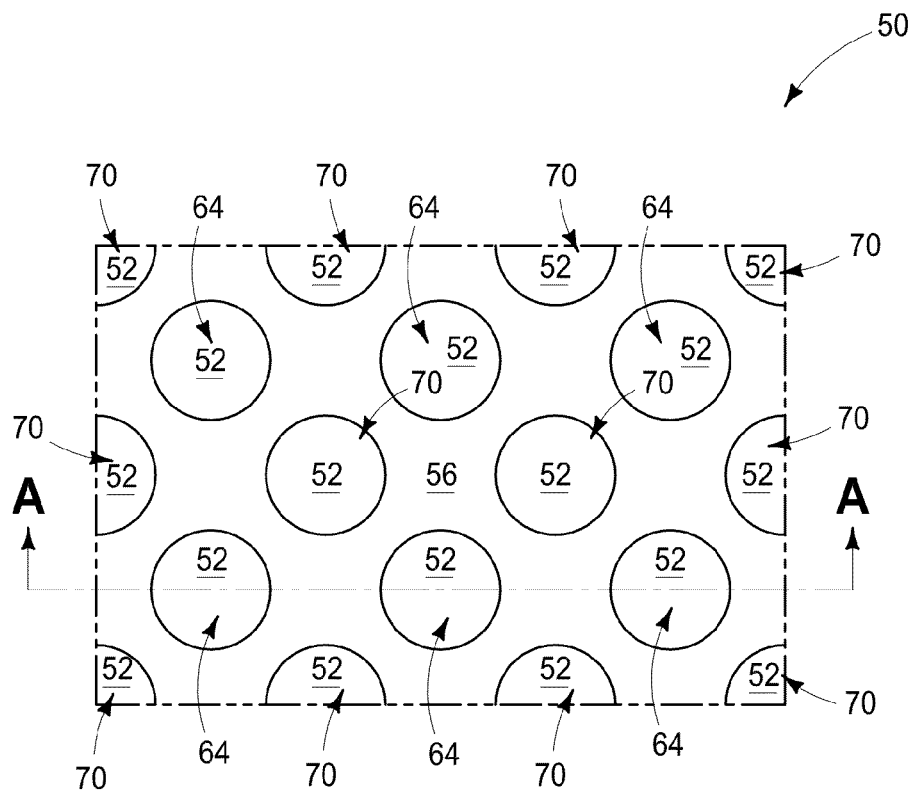
Figure 13A:
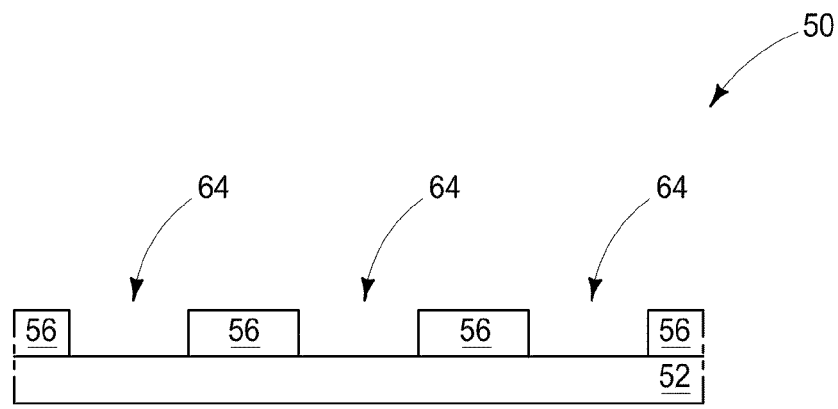

Referring to FIGS. 13 and 13A, the openings 64 and 70 are extended through electrically insulative material 56 (i.e., are transferred through material 56) to expose an upper surface of the semiconductor base 52, and materials 58, 60, 66 and 20 are removed with one or more suitable etches.

The materials 58, 60, 66 and 20 are removed at the processing stage of FIGS. 13 and 13A in the shown embodiment. In other embodiments one or more of such materials may remain at the processing stage of FIGS. 13 and 13A, and at other processing stages subsequent that of FIGS. 13 and 13A.

Figure 14:
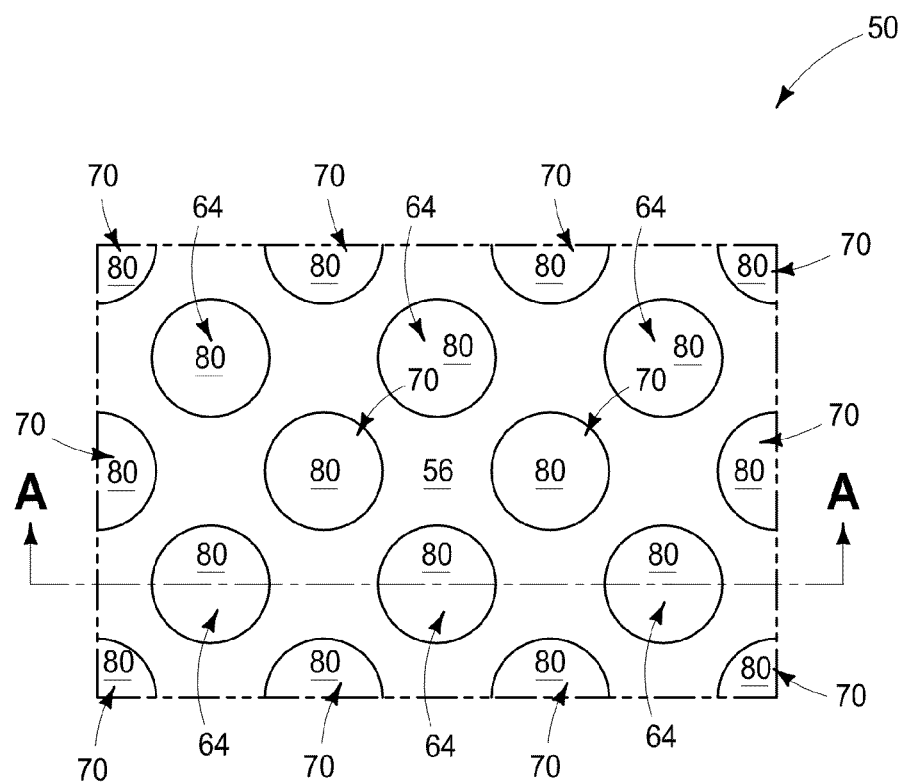
FIG. 14 is a diagrammatic top view of a semiconductor construction at an example process stage following that of FIG. 13.
Figure 14A:
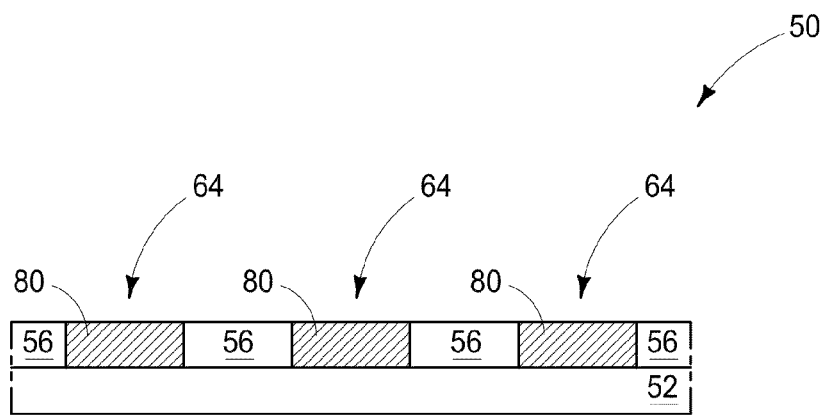
FIG. 14A is a diagrammatic cross-sectional side view along the line A-A of FIG. 14.

Referring to FIGS. 14 and 14A, electrically conductive material 80 is formed within openings 64 and 70 and patterned into a series of electrically conductive contacts extending to an upper surface of base 52. The electrically conductive material 80 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some embodiments, material 80 may be deposited to overfill openings 64 and 70, and then excess material may be removed by chemical-mechanical polishing (CMP) or other suitable planarization to form the construction shown in FIGS. 14 and 14A. In some embodiments, the electrically conductive contacts may extend to an array of electrically conductive nodes (not shown) present on an upper surface of base 52.

Figure 15:
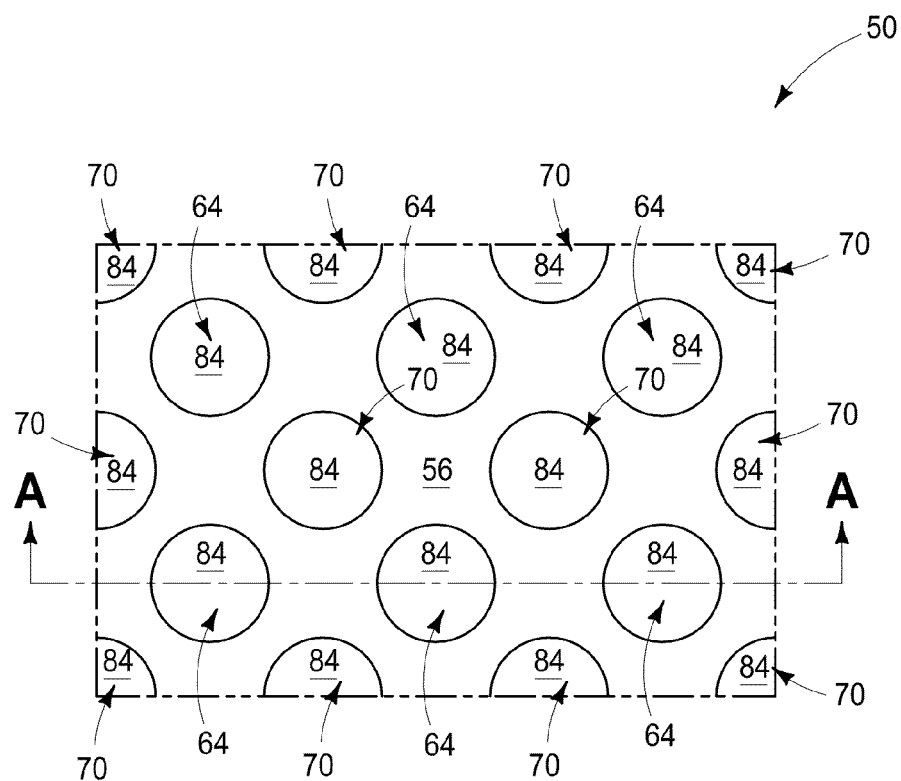
FIG. 15 is a diagrammatic top view of a semiconductor construction at an another example process stage following that of FIG. 13.
Figure 15A:
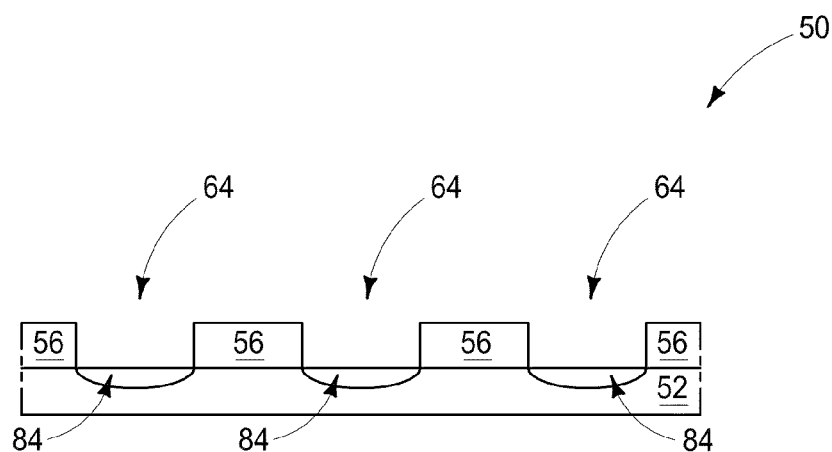
FIG. 15A is a diagrammatic cross-sectional side view along the line A-A of FIG. 15.

FIGS. 14 and 14A illustrate an example processing stage that may follow formation of openings 64 and 70. In other embodiments, the openings may be utilized for other processing associated with integrated circuit fabrication. For instance, the pattern of openings 64 and 70 may be transferred into the semiconductor base 52 by etching into the base to form recesses extending into the base and/or to pattern materials associated with the base. As another example, the pattern of openings 64 and 70 may be transferred into the semiconductor base 52 by implanting dopant through the openings to form dopant implant regions within locations defined by the openings. For instance, FIGS. 15 and 15A show construction 50 at a processing stage subsequent to that of FIGS. 13 and 13A in an embodiment in which dopant is implanted through the openings to form implant regions 84 within semiconductor base 52. In some embodiments, an upper surface of base 52 may comprise silicon, and the implanted dopant may be either n-type or p-type dopant utilized to form conductively-doped regions 84.

Although the embodiment of FIGS. 11 and 11A forms the brush layer on materials 66 and 60, in other embodiments the spacer material 66 may be removed prior to formation of the brush layer. The brush layer may then be formed selectively on silicon oxynitride material 60 relative to the underlying carbon-containing material 58. An example of such processing is described with reference to FIGS. 16 and 17.

Figure 16:
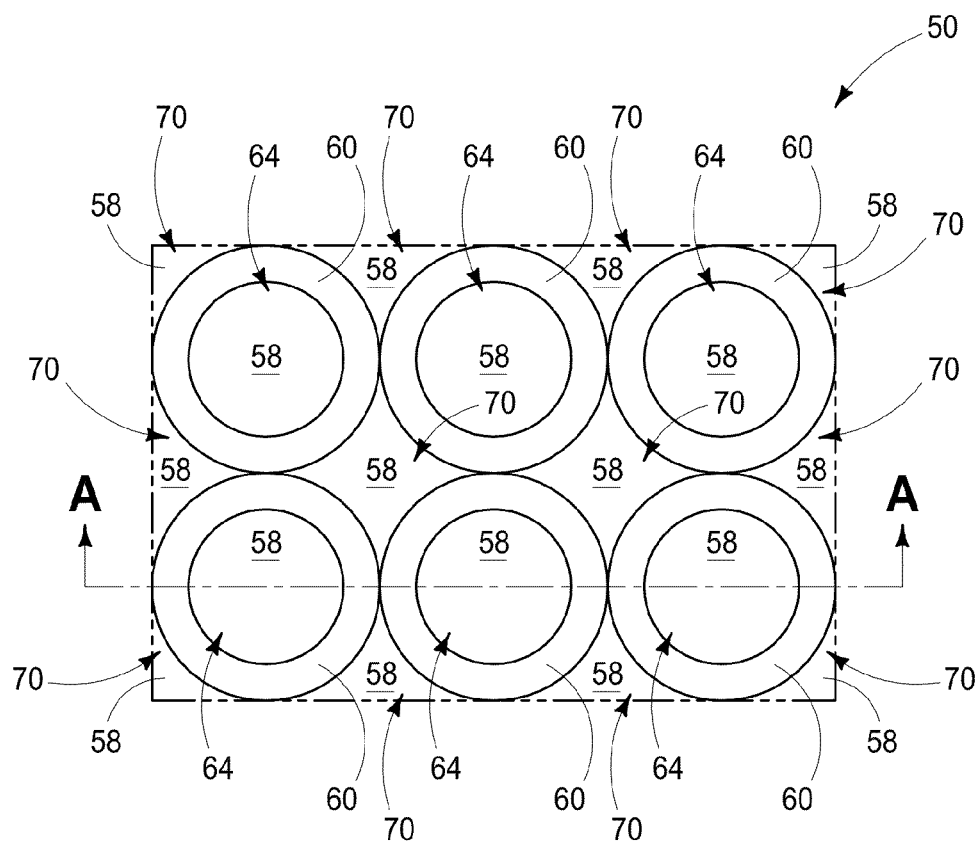
FIG. 16 is a diagrammatic top view of a semiconductor construction at another example processing stage which may follow that of FIG. 10.
Figure 16A:
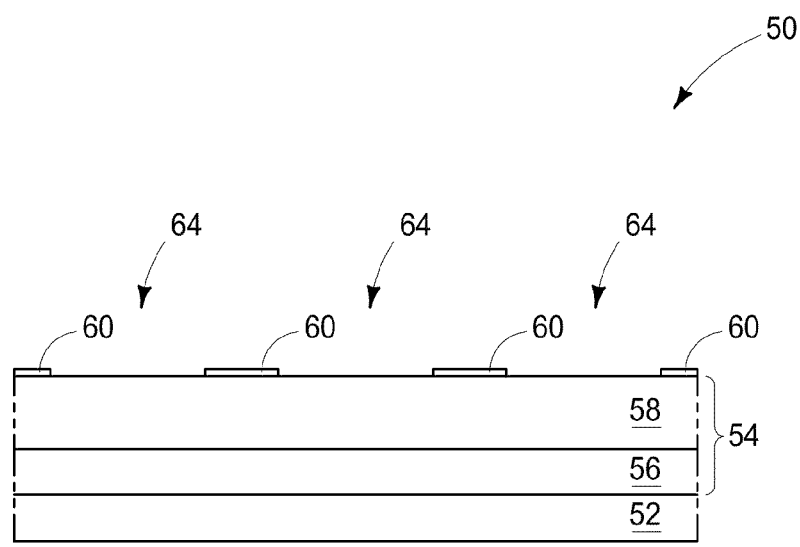
FIG. 16A is a diagrammatic cross-sectional side view along the line A-A of FIG. 16.

FIGS. 16 and 16A show construction 50 at a processing stage which may follow that of FIGS. 10 and 10A, and specifically show material 66 removed to leave the patterned material 60 over carbon-containing material 58.

Figure 17:
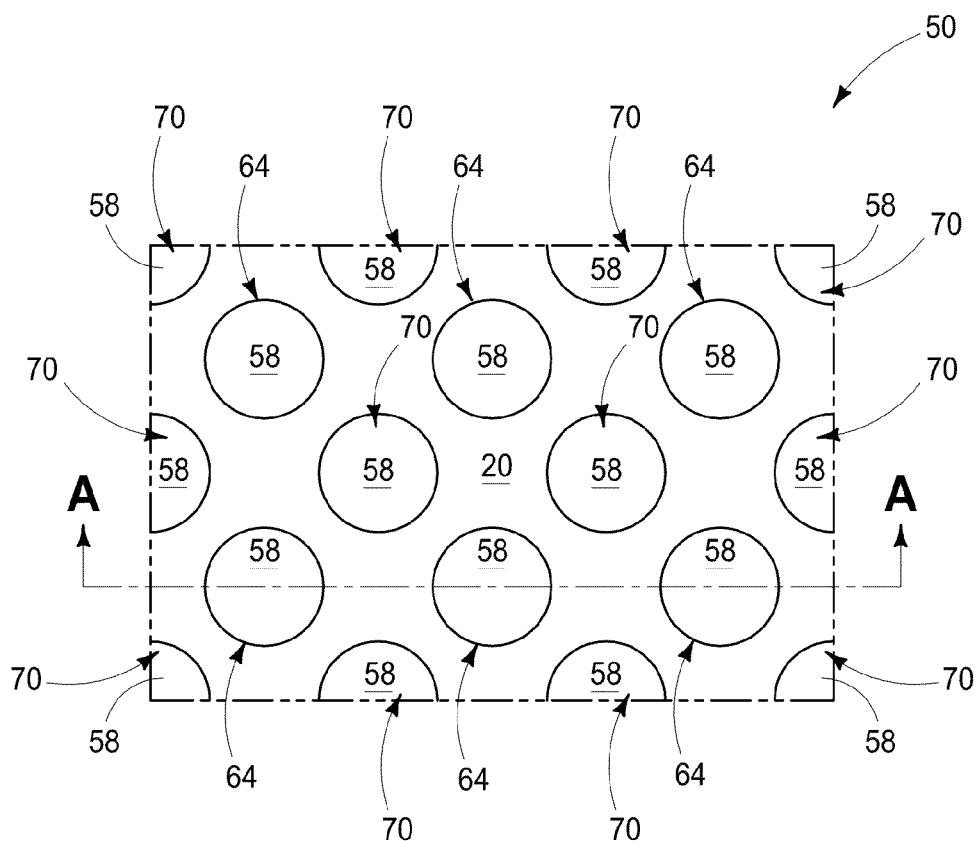
FIG. 17 is a diagrammatic top view of a semiconductor construction at an example processing stage following that of FIG. 16.
Figure 17A:
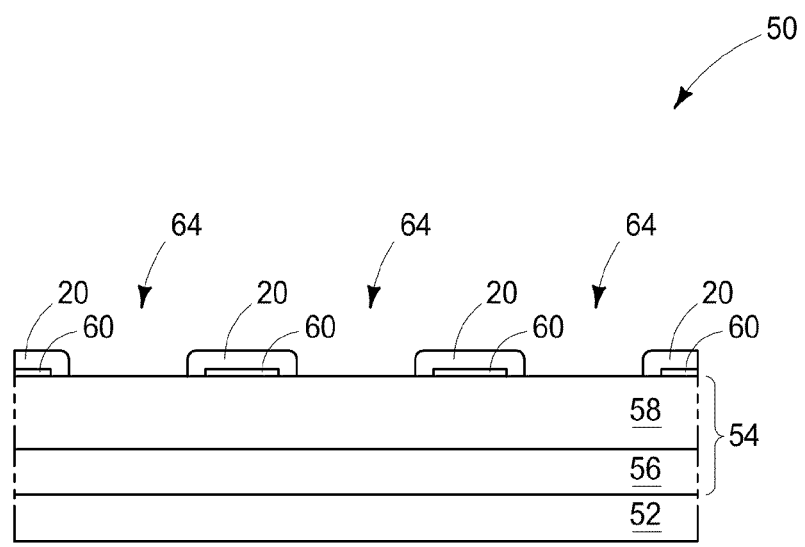
FIG. 17A is a diagrammatic cross-sectional side view along the line A-A of FIG. 17.

Referring next to FIGS. 17 and 17A, brush layer 20 is selectively formed across exposed surfaces of silicon oxynitride 60 relative to exposed surfaces of carbon-containing material 58, which reduces differences between openings 64 and 70. Processing analogous to the various processes described above with reference to FIGS. 12-15 may be conducted subsequent to the processing stage of FIGS. 17 and 17A.

Figure 18:
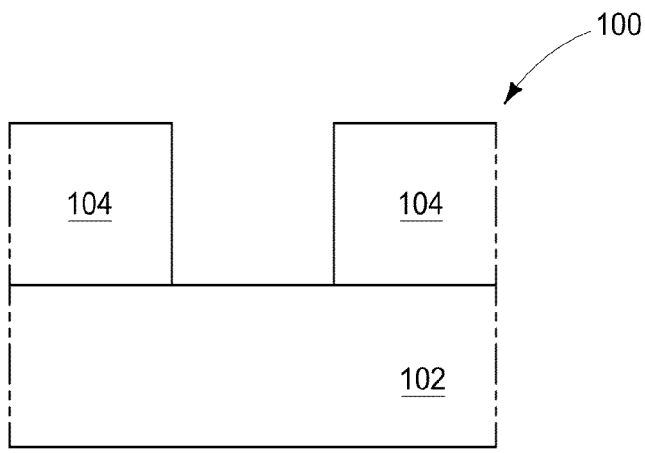
FIGS. 18-20 are diagrammatic cross-sectional side views of a semiconductor construction at various processing stages of another example embodiment.
Figure 19:
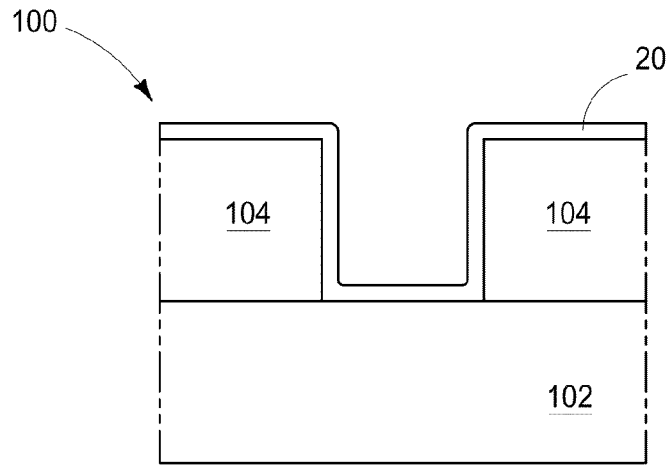
Figure 20:
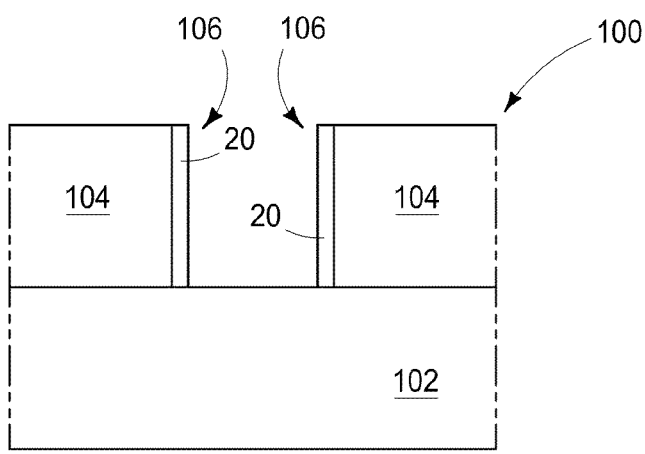

As discussed above with reference to FIGS. 11 and 11A, in some embodiments a brush layer may be formed non-selectively over multiple materials, and then anisotropically etched to form features (for instance, spacers) suitable for subsequent process stages. FIGS. 18-20 illustrate an example embodiment in which a brush layer is formed non-selectively across multiple materials.

Referring to FIG. 18, a construction 100 is shown to comprise a patterned second material 104 over a first material 102. The first and second materials may be compositionally different from one another.

Referring to FIG. 19, a brush layer 20 is formed non-selectively along surfaces of materials 104 and 102. In some embodiments, the surfaces of materials 102 and 104 may comprise oxygen, and the brush layer may be formed by reaction of a brush layer precursor with such oxygen-containing surfaces.

Referring to FIG. 20, the brush layer is anisotropically etched to form spacers 106. Such spacers may then be utilized for subsequent processing analogous to processing described above with reference to previous figures of this disclosure. (In other embodiments, not shown, the brush layer 20 may selectively form only on material 104 at the processing stage of FIG. 19, in which case the anisotropic etch of FIG. 20 may be omitted.)

In some embodiments, it may be desired to chemically modify a brush layer to alter chemical characteristics of the brush layer and thereby improve suitability of the brush layer as a hardmask. For instance, in some embodiments the brush layer may comprise a silicon-containing polymer (which may comprise, for example, at least about 17 percent silicon [by atomic mass]), and it may be desired to incorporate oxygen into the brush layer. In some embodiments, the chemical modification may be conducted prior to the anisotropic etch described in FIG. 20, and in some embodiments the chemical modification may be conducted after a selective deposition analogous to that described above with reference to FIGS. 11 and 11A. A deposition analogous to that of FIGS. 11 and 11A may include a selective deposition along a masking material analogous to material 66 to leave a surface exposed (analogous to the surface of material 58) wherein the exposed surface may or may not be a carbon-containing material. In some embodiments, the chemical modification may comprise exposure of a brush layer to $O_2$ plasma to convert the brush layer to an oxide film. Such exposure may shrink and smooth brush-layer-lined openings in some applications.

In some embodiments, organic brush layers may be utilized to form spacers. For instance, an organic brush layer (for instance, polystyrene) may be applied to $SiO_2$ features (like the features 68 of FIGS. 9 and 9A in some embodiments), and then the $SiO_2$ features may be removed to leave spacers comprising the organic material of the brush layer. Thus, organic material of a brush layer may form spin-on spacers in some embodiments.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a pattern. A first mask is formed over a material. The first mask has features extending therein and defining a first pattern. The first pattern has a first level of uniformity across a distribution of the features. A brush layer is formed across the first mask and within the features to narrow the features and to create a second mask from the first mask. The second mask has a second level of uniformity across the narrowed features which is greater than the first level of uniformity. A pattern is transferred from the second mask into the material.

Some embodiments include a method of forming a pattern. A stack is formed over a semiconductor substrate. The stack comprises carbon over an electrically insulative material. A first mask is formed over the carbon. The first mask has openings extending therein with the openings defining a first pattern. The first pattern has a first level of uniformity across a distribution of the openings. A brush layer is formed across the first mask and within the openings to narrow the openings and create a second mask from the first mask. The brush layer is selectively formed along material of the first mask relative to the carbon. The second mask has a second level of uniformity across the narrowed openings which is greater than the first level of uniformity. A pattern is transferred from the second mask through the carbon and the electrically insulative material.

Some embodiments include a method of forming a pattern. Patterned photoresist is formed to have a plurality of spaced-apart openings extending therethrough. The openings are widened. A spacer material is deposited within widened openings. The spacer material is anisotropically etched and the photoresist is removed. The anisotropic etching forms spacers from the spacer material. The spacers are annular rings and are a first mask having a pattern extending therethrough which has two shapes of openings. A brush layer is formed across the spacer material and within the openings to alleviate differences between the two shapes and form a second mask from the first mask. A pattern is transferred from the second mask into a second material under the second mask.

Some examples are provided below to assist the reader in understanding some aspects of the invention. The specific parameters of the examples are not to limit the invention in any way, except to the extent, if any, that such parameters are expressly recited in the claims which follow.

EXAMPLES

The following materials were passed through a column packed with activated A-2 grade alumina before being used in the specific Examples 1-5 described below; namely tetrahydrofuran (THF), (99.9% pure available from Aldrich), styrene (available from Aldrich), and cyclohexane (HPLC grade available from Fischer). Hydroxyl-terminated poly(dimethylsiloxane) (PDMS-OH) with $M_n$=10 kg/mol and $M_w/M_n$=1.10 was purchased from Gelest and used as received. All the other materials used in the specific Examples 1-5 described below were commercial materials that were used as received.

The number average molecular weight, $M_N$, and polydispersity values reported in Examples 1-5 were measured by gel permeation chromatography (GPC) on an Agilent 1100 series liquid chromatography (LC) system equipped with an Agilent 1100 series refractive index and MiniDAWN light scattering detector (Wyatt Technology Co.). Samples were dissolved in HPLC grade THF at a concentration of approximately 1 mg/mL and filtered through a 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton nuclear magnetic resonance ($^1$H NMR) spectroscopy results referred to in the Examples that follow was done on a Varian INOVA 400 MHz NMR spectrometer using a delay time of 10 seconds to ensure complete relaxation of protons for quantitative integrations. Chemical shifts are reported relative to tetramethylsilane.

Example 1

PDMS-OH Synthesis

Trimethylsilyl lithium silanolate (0.060 g, 0.62 mmol) was weighed into a 20 mL vial and dissolved in 2 g dry THF. Next, freshly sublimed hexamethyl(cyclotrisiloxane) monomer (D3, 9.7 g, 44 mmol) was weighed into a 200 mL jar and then dissolved in 48 g THF. The lithium silanolate solution was added to the D3 solution along with a stir bar, and the contents were left stirring at room temperature (RT) for 1 h before quenching with ~½ mL chlorodimethyl silane. The reaction mixture was stirred overnight and then precipitated into 600 mL MeOH. The MeOH was decanted away, leaving a viscous liquid which was air dried overnight, and then dried further overnight in a vacuum oven at 60° C. to yield 6.8 g of Si—H terminated PDMS with Mn~14,600 g/mol as determined by NMR. To convert the Si—H terminated PDMS to PDMS-OH, the Si—H terminated PDMS (4.0 g) and allyl alcohol (0.29 g, 4.9 mmol, 18 eq. based on silane) were combined in a 20 mL vial. The vial was placed under a blanket of $N_2$, and a small scoop of 5% Pt/C was added to it. The vial was capped and heated to 110° C. for 15 h in a heating block. Analysis by $^1$H NMR following the reaction showed complete conversion of the silane. The crude reaction mixture was filtered through a frit and 1 μm filter using hexanes to remove the residual Pt/C catalyst. The polymer was isolated by drying at 60° C. under vacuum.

Example 2

Substrate Preparation and Imaging

Figure 21:
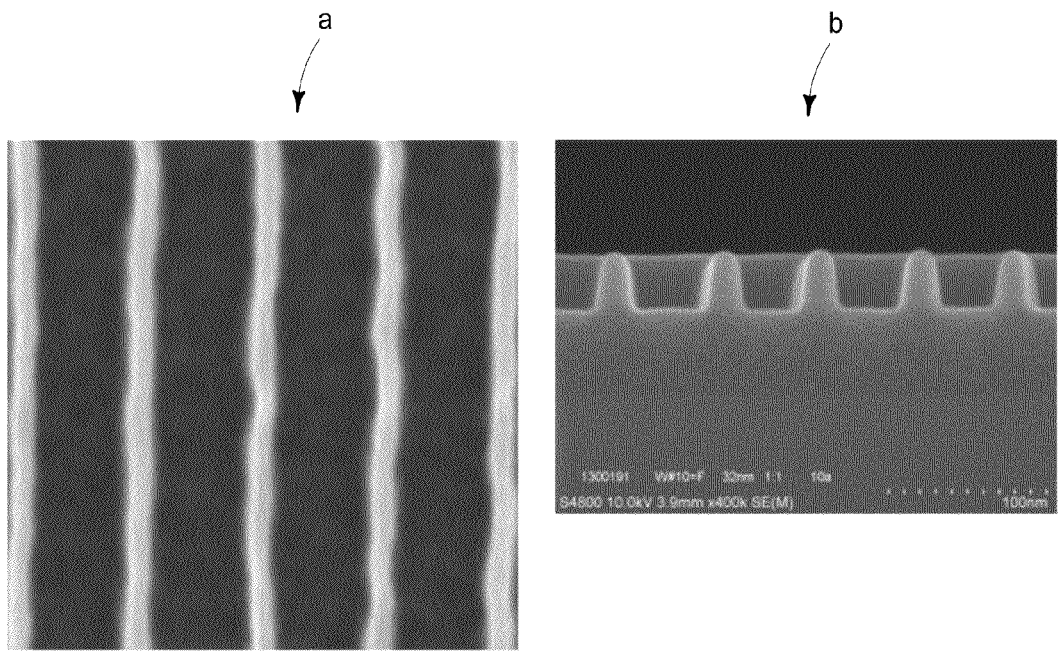
FIG. 21 is a top view (a) and a side view (b) of a patterned substrate treated in accordance with Example 2.

A pattern of $SiO_2$ lines on a carbon floor were prepared using standard lithographic and etch techniques. Small coupons were cut from the wafer and used as the substrate in Example 2. Before treatment, a coupon was evaluated by microscopy after mounting on a 25 mm×6 mm aluminum sample stub with the aid of double-sided carbon tape. Top-down scanning electron microscopic (SEM) images were recorded by a Hitachi CG4000 SEM (Hitachi Co., Japan) operating at 0.2 to 2 kV accelerating voltage and 400,000 magnifications. Cross section (SEM) images were recorded by a Hitachi S-4800 FE-SEM (Hitachi Co., Japan) operating at 15 kV accelerating voltage and 400,000 magnifications. Critical dimension (CD), line width roughness (LWR), and line edge roughness (LER) values were measured using Hitachi's Terminal PC Data Processing Software, V5.04~, and Terminal PC Offline CD Measurement Software, V5.03~, and are reported as the average values from 5 images. Representative images are shown in FIG. 21. The incoming patterned substrate had lines with a vertical profile and CD=15 nm, LWR 3σ=2.9 nm, and LER 3σ=5.2 nm.

Example 3

PDMS-OH Brush Grafting

Figure 22:
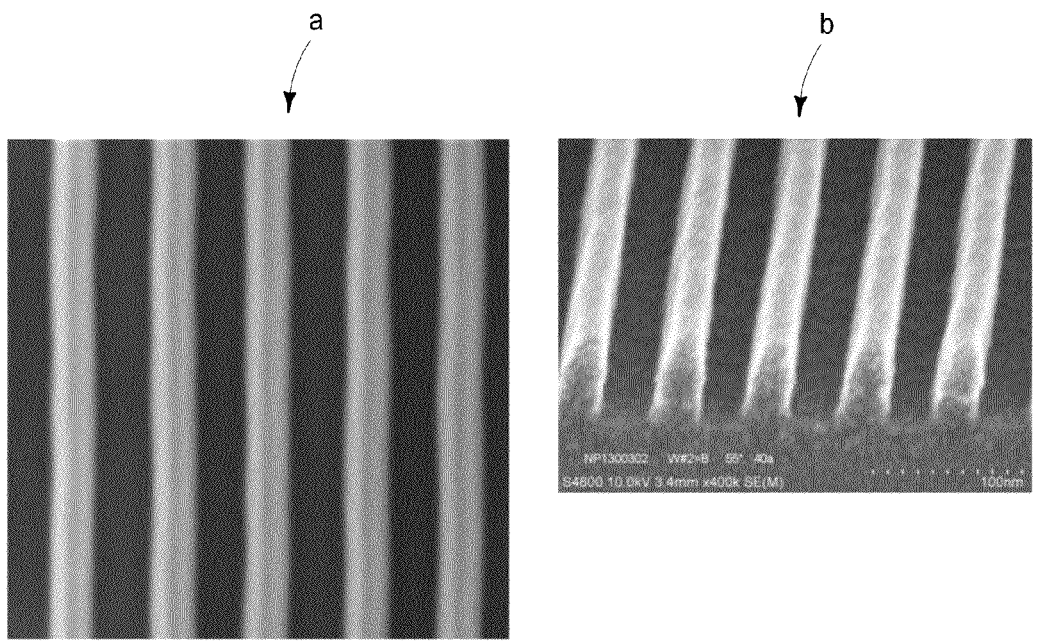
FIG. 22 is a top view (a) and a side view (b) of a patterned substrate treated in accordance with Example 3.

A solution of PDMS-OH was prepared by dissolving the PDMS-OH in heptane to form a 1.3 wt % solution. The solution was hand filtered through a 0.2 μm Whatman syringe filter, and the product filtrate material was used to coat the patterned coupon. A thin film of the PDMS-OH was formed on the patterned substrate by spin coating the solution using conditions that gave a 21 nm film on an unpatterned silicon substrate as measured using a NanoSpec/AFT 2100 Film Thickness Measurement tool, followed by a soft bake at 150° C. for 60 seconds to remove residual solvent. The coated substrate was then subjected to a second bake at 250° C. for 120 seconds to induce grafting. Residual ungrafted PDMS-OH was then removed by washing with a puddle of heptane and spin-drying, followed by another soft bake at 150° C. for 60 seconds to remove residual solvent. The coupon was then evaluated by microscopy after mounting on a 25 mm×6 mm aluminum sample stub with the aid of double-sided carbon tape. Top-down scanning electron microscopic (SEM) images were recorded by a Hitachi CG4000 SEM (Hitachi Co., Japan) operating at 0.2 to 2 kV accelerating voltage and 400,000 magnifications. Cross section (SEM) images were recorded by a Hitachi S-4800 FE-SEM (Hitachi Co., Japan) operating at 15 kV accelerating voltage and 400,000 magnifications. Critical dimension (CD), line width roughness (LWR), and line edge roughness (LER) values were measured using Hitachi's Terminal PC Data Processing Software, V5.04~, and Terminal PC Offline CD Measurement Software, V5.03~, and are reported as the average values from 5 images. Representative images are shown in FIG. 22. After PDMS-OH treatment, the lines on the substrate increased in CD, were noticeably smoother, and maintained a vertical profile without footing. The lines were characterized with CD=28 nm, LWR 3σ=1.4 nm, and LER 3σ=2.5 nm.

Example 4

Substrate Preparation and Imaging

Figure 23:
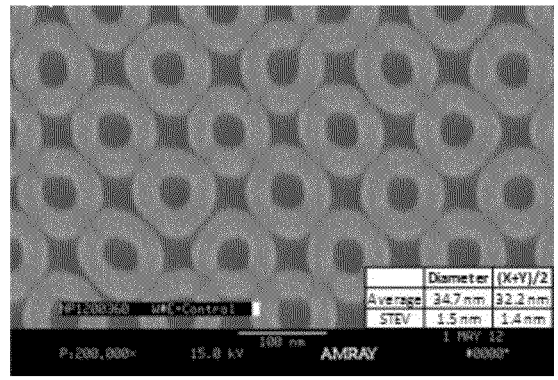
FIG. 23 is a top view of a patterned substrate treated in accordance with Example 4.

A pattern of SiON crowns was prepared by first forming a patterned photoresist having a plurality of spaced-apart holes using standard lithographic techniques. The holes were then widened and a SiON spacer material was deposited within the widened openings. The substrate was then anisotropically etched to remove the photoresist to form a pattern of annular rings with two shapes of openings. Small coupons were then cut from the wafer and used as the substrate in Example 4. Before treatment, a coupon was evaluated by microscopy after mounting on a 25mm×6mm aluminum sample stub with the aid of double-sided carbon tape. A Denton Vacuum DV-502A plasma coater was used to sputter a coating of iridium (4 nm) in order to render the sample conductive under the electron beam. Top-down scanning electron microscopic (SEM) images were recorded by an AMRAY 4200 operated at 15 kV under a working distance of ~10 mm. The images were analyzed using ImageJ software. A representative image is shown in FIG. 23. The pattern consisted of annular rings with two shapes of openings, round holes corresponding to the original holes in the photoresist and diamond-shaped holes in the regions around the crowns where adjacent crowns converge and touch one another. The round holes measured 34.7±1.5 nm, while the average end-to-end distance of the diamond shaped holes measured 32.3±1.4 nm.

Example 5

PDMS-OH Brush Grafting

Figure 24:
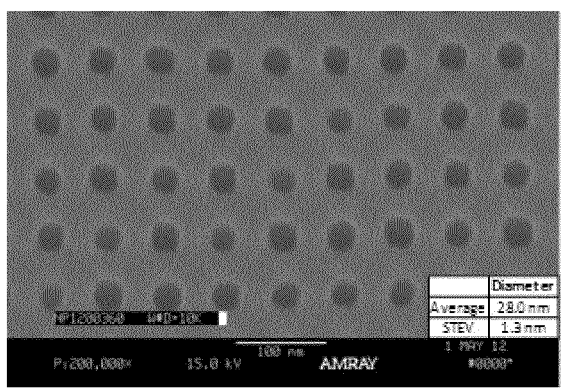
FIG. 24 is a top view of a patterned substrate treated in accordance with Example 5.

A solution of PDMS-OH (0.8 wt %) was prepared in heptanes and filtered through a Teflon filter having a 0.2 μm pore size. The filtered solution was coated on a coupon of the crown template from Example 4 by spin coating at 1500 rpm. The coated wafer was then annealed under $N_2$ at 300° C. for 120 seconds. The substrate was then treated to remove unreacted PDMS-OH by washing twice with heptane using the following process: puddling heptane on the wafer, allowing it to sit for 60 seconds, spinning the wafer dry at 3000 rpm over 60 seconds, repeating this heptane puddling process, and then baking the substrate to remove residual heptane at 150° C. for 60 seconds. The treated coupon was then evaluated by microscopy after mounting on a 25 mm×6 mm aluminum sample stub with the aid of double-sided carbon tape. A Denton Vacuum DV-502A plasma coater was used to sputter a coating of iridium (4 nm) in order to render the sample conductive under the electron beam. Top-down scanning electron microscopic (SEM) images were recorded by an AMRAY 4200 operated at 15 kV under a working distance of ~10 mm. The images were analyzed using ImageJ software. A representative image is shown in FIG. 24. After treatment, the holes are smaller and more uniform in size (28.0±1.3 nm) and have no discernible difference in shape as the brush process effectively rounded the convex diamond-shaped holes into round holes.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern, comprising:
   forming a first mask over a material, the first mask having features extending therein and defining a first pattern; the first pattern having a first level of uniformity across a distribution of the features;
   forming a brush layer across the first mask and within the features to narrow the features and create a second mask from the first mask; the second mask having a second level of uniformity across the narrowed features which is greater than the first level of uniformity;
   transferring a pattern from the second mask into the material; and
   wherein the first mask comprises a surface containing one or more elements from group 16 of the periodic table, and wherein the brush layer is formed through covalent bonding of one or more of polymeric organic siloxanes to the surface through such elements.

2. A method of forming a pattern, comprising:
   forming a first mask over a material, the first mask having features extending therein and defining a first pattern; the first pattern having a first level of uniformity across a distribution of the features;
   forming a brush layer across the first mask and within the features to narrow the features and create a second mask from the first mask; the second mask having a second level of uniformity across the narrowed features which is greater than the first level of uniformity;
   transferring a pattern from the second mask into the material; and
   wherein:
   the material consists of carbon;
   the first mask comprises an oxygen-containing surface; and the brush layer is formed through reaction of precursor comprising poly(dimethylsiloxane) with the oxygen-containing surface.

3. The method of claim 2 wherein the poly(dimethylsiloxane) consists of polymers within a molecular weight range of from about 5,000 atomic mass units to about 110,000 atomic mass units.

4. The method of claim 1 wherein the features of the first mask have irregular peripheral surfaces, and wherein the brush layer reduces irregularities across the peripheral surfaces.

5. The method of claim 1 wherein the transferring comprises an etch of the material.

6. The method of claim 1 wherein the transferring comprises an implant of dopant into the material.

7. The method of claim 1 wherein the narrowed features of the second mask are openings having substantially circular peripheries.

8. A method of forming a pattern, comprising:
forming a first mask over a material, the first mask having features extending therein and defining a first pattern; the first pattern having a first level of uniformity across a distribution of the features;
forming a brush layer across the first mask and within the features to narrow the features and create a second mask from the first mask; the second mask having a second level of uniformity across the narrowed features which is greater than the first level of uniformity;
transferring a pattern from the second mask into the material; and
chemically modifying the brush layer prior to the transferring, wherein the chemically modification comprises exposure of the brush layer to oxygen.

9. A method of forming a pattern, comprising:
forming a first mask over a material, the first mask having features extending therein and defining a first pattern; the first pattern having a first level of uniformity across a distribution of the features;
forming a brush layer across the first mask and within the features to narrow the features and create a second mask from the first mask; the second mask having a second level of uniformity across the narrowed features which is greater than the first level of uniformity;
transferring a pattern from the second mask into the material; and
chemically modifying the brush layer prior to the transferring, wherein the chemically modification comprises exposure of the brush layer to $O_2$ plasma.

10. A method of forming a pattern, comprising:
forming a stack over a semiconductor substrate, the stack comprising carbon over an electrically insulative material;
forming a first mask over the carbon, the first mask having openings extending therein with the openings defining a first pattern; the first pattern having a first level of uniformity across a distribution of the openings;
forming a brush layer across the first mask and within the openings to narrow the openings and create a second mask from the first mask; the brush layer being selectively formed along material of the first mask relative to the carbon; the second mask having a second level of uniformity across the narrowed openings which is greater than the first level of uniformity;
transferring a pattern from the second mask through the carbon and the electrically insulative material; and
wherein the forming of the first mask comprises:
photolithographically patterning photoresist to form a first arrangement of openings within the photoresist;
widening the openings of the first arrangement to form a second arrangement of openings; and
lining openings of the second arrangement with a spacer material having a reactive surface which reacts with brush layer precursor; the lined openings being the first pattern of openings of the first mask.

11. The method of claim 10 wherein the reactive surface comprises oxygen.

12. The method of claim 10 wherein the reactive surface is formed by plasma oxidation of a surface of the spacer material.

13. A method of forming a pattern, comprising:
forming a stack over a semiconductor substrate, the stack comprising carbon over an electrically insulative material;
forming a first mask over the carbon, the first mask having openings extending therein with the openings defining a first pattern; the first pattern having a first level of uniformity across a distribution of the openings;
forming a brush layer across the first mask and within the openings to narrow the openings and create a second mask from the first mask; the brush layer being selectively formed along material of the first mask relative to the carbon; the second mask having a second level of uniformity across the narrowed openings which is greater than the first level of uniformity;
transferring a pattern from the second mask through the carbon and the electrically insulative material;
wherein silicon oxynitride is over the carbon, and wherein the forming of the first mask comprises:
photolithographically patterning photoresist to form a first arrangement of openings within the photoresist;
widening the openings of the first arrangement to form a second arrangement of openings;
lining openings of the second arrangement with a spacer material to form the first pattern of openings; and
transferring the first pattern through the silicon oxynitride to thereby form the first mask to comprise the silicon oxynitride having the first pattern of openings extending therethrough.

14. A method of forming a pattern, comprising:
forming patterned photoresist having a plurality of spaced-apart openings extending therethrough;
widening the openings;
depositing a spacer material within widened openings, and then anisotropically etching the spacer material and removing the photoresist; the anisotropic etching forming spacers from the spacer material; such spacers being annular rings and being a first mask having a pattern extending therethrough which has two shapes of openings;
forming a brush layer across the spacer material and within the openings to alleviate differences between the two shapes and form a second mask from the first mask;
transferring a pattern from the second mask into a second material under the second mask;
wherein the spacer material comprises silicon dioxide or silicon oxynitride; and
wherein the brush layer is formed from precursor comprising polymeric organic siloxane.

15. A method of forming a pattern, comprising:
forming patterned photoresist having a plurality of spaced-apart openings extending therethrough;
widening the openings;

depositing a spacer material within widened openings, and then anisotropically etching the spacer material and removing the photoresist; the anisotropic etching forming spacers from the spacer material; such spacers being annular rings and being a first mask having a pattern extending therethrough which has two shapes of openings;

forming a brush layer across the spacer material and within the openings to alleviate differences between the two shapes and form a second mask from the first mask;

transferring a pattern from the second mask into a second material under the second mask;

wherein the spacer material comprises silicon dioxide or silicon oxynitride; and wherein the brush layer is formed from precursor comprising poly(dimethylsiloxane).

* * * * *